US012243771B2

(12) United States Patent
Arnold et al.

(10) Patent No.: US 12,243,771 B2
(45) Date of Patent: Mar. 4, 2025

(54) SELECTIVE PATTERNING OF VIAS WITH HARDMASKS

(71) Applicant: INTERNATIONAL BUSINESS MACHINES CORPORATION, Armonk, NY (US)

(72) Inventors: John C. Arnold, North Chatham, NY (US); Ashim Dutta, Clifton Park, NY (US); Dominik Metzler, Clifton Park, NY (US); Timothy M. Philip, Albany, NY (US); Sagarika Mukesh, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/666,767

(22) Filed: Feb. 8, 2022

(65) Prior Publication Data

US 2022/0165612 A1 May 26, 2022

Related U.S. Application Data

(62) Division of application No. 16/570,059, filed on Sep. 13, 2019, now Pat. No. 11,276,607.

(51) Int. Cl.
*H01L 21/768* (2006.01)
*H01L 21/033* (2006.01)
*H01L 23/522* (2006.01)

(52) U.S. Cl.
CPC .... *H01L 21/76816* (2013.01); *H01L 21/0332* (2013.01); *H01L 21/0337* (2013.01);
(Continued)

(58) Field of Classification Search
CPC .......... H01L 21/76816; H01L 21/0332; H01L 21/0337; H01L 21/76883; H01L 21/76897;
(Continued)

(56) References Cited

U.S. PATENT DOCUMENTS 5,882,996 A 3/1999 Dai
8,361,704 B2 1/2013 Colburn et al.
(Continued)

OTHER PUBLICATIONS

List of IBM Patents or Patent Applications Treated as Related dated Feb. 8, 2022, 2 pages.
(Continued)

*Primary Examiner* — Mohammad A Rahman
(74) *Attorney, Agent, or Firm* — Tutunjian & Bitetto, P.C.; Joseph P. Curcuru

(57) ABSTRACT

Methods and structures for forming vias are provided. The method includes forming a structure that includes an odd line hardmask and an even line hardmask. The odd line hardmask and the even line hardmask include different hardmask materials that have different etch selectivity with respect to each other. The method includes patterning vias separately into the odd line hardmask and the even line hardmask based on the different etch selectivity of the different hardmask materials. The method also includes forming via plugs at the vias. The method includes cutting even line cuts and odd line cuts into the structure. The even line cuts and the odd line cuts are self-aligned with the vias. The vias are formed at line ends of the structure.

19 Claims, 13 Drawing Sheets

(52) U.S. Cl.
CPC .. *H01L 21/76883* (2013.01); *H01L 21/76897* (2013.01); *H01L 23/5226* (2013.01)

(58) Field of Classification Search
CPC ........... H01L 23/5226; H01L 21/76885; H01L 29/66515; H01L 2225/06541; H01L 2221/1026
See application file for complete search history.

(56) References Cited

U.S. PATENT DOCUMENTS

| | | | |
|---|---|---|---|
| 8,813,012 | B2 | 8/2014 | Rieger et al. |
| 8,992,792 | B2 | 3/2015 | Chang et al. |
| 9,418,935 | B1 | 8/2016 | Shao et al. |
| 9,991,156 | B2 | 6/2018 | Burns et al. |
| 10,020,223 | B1 | 7/2018 | Anderson et al. |
| 10,049,920 | B1* | 8/2018 | Anderson ........... H01L 23/5283 |
| 10,157,789 | B2 | 12/2018 | Chen et al. |
| 10,177,031 | B2 | 1/2019 | Bao et al. |
| 2015/0200110 | A1 | 7/2015 | Li et al. |
| 2016/0118348 | A1* | 4/2016 | Farooq ................ H01L 21/2885 438/109 |
| 2016/0379929 | A1* | 12/2016 | Feurprier .......... H01L 21/76802 257/774 |
| 2017/0194252 | A1* | 7/2017 | Chang ................. H01L 23/5286 |

OTHER PUBLICATIONS

Paolillo, "Direct Metal Etch of Ruthenium for Advanced Interconnect", Journal of Vacuum Science & Technology B, vol. 36, May 2018, 9 pages.

Raley, "Self-Aligned Blocking Integration Demonstration for Critical sub 40nm Pitch Mx Level Patterning", SPIE Advanced Lithography, vol. 10149, Apr. 2017, 11 pages.

* cited by examiner

500

```
Form a structure with an odd line hardmask and an even line hardmask. The
even and odd metal lines have different hardmask materials that have different
selectivity with respect to each other
510
```

```
Pattern vias separately into the odd line hardmask and the even line hardmask. The
vias can be patterned using direct lithography and spacer based tone inversion or a
direct self-assembly (DSA) scheme
520
```

```
Cut even and odd lines using metal lithography.
The line cuts are self-aligned with the via
530
```

FIG. 13

SELECTIVE PATTERNING OF VIAS WITH HARDMASKS

BACKGROUND

The present invention generally relates to via placement, and more particularly to selective patterning of vias with hardmasks.

Electrical interconnection between conductive patterns in various layers of multilayer boards can be accomplished through vias. The formation of the vias differs depending on the technology of a printed circuit board. Via holes can extend through the complete multilayer board, in which case the vias and the electrical interconnections joint intersect copper patterns in each of the layers, or can extend only part way through the structure. In the latter case, these are blind vias that only interconnect copper in the board layers that have actually been penetrated.

SUMMARY

In accordance with an embodiment of the present invention, a method for forming vias is provided. The method includes forming a structure that includes an odd line hardmask and an even line hardmask. The odd line hardmask and the even line hardmask include different hardmask materials that have different etch selectivity with respect to each other. The method includes patterning vias separately into the odd line hardmask and the even line hardmask based on the different etch selectivity of the different hardmask materials. The method also includes forming via plugs at the vias. The method includes cutting even line cuts and odd line cuts into the structure. The even line cuts and the odd line cuts are self-aligned with the vias. The vias are formed at line ends of the structure.

In accordance with an embodiment of the present invention, a method for forming vias is provided. The method includes selectively depositing a first hardmask including multiple lines on a structure. The method also includes selectively depositing a second hardmask in alternating lines to the multiple lines. The first hardmask and the second hardmask include different hardmask materials that have different etch selectivity with respect to each other. The method further includes selectively patterning either or both of the first hardmask and the second hardmask.

In accordance with an embodiment of the present invention, a semiconductor structure is provided. The semiconductor structure includes a first metal line colinearly disposed relative to a second metal structure in a same layer. The self-aligned vias are positioned on line ends. The line ends are formed adjacent to line cut regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 13 is a flow diagram showing a method for placing vias at line ends by using via hardmask for self-aligned line cut, in accordance with an embodiment of the present invention.

DETAILED DESCRIPTION

Figure 1:
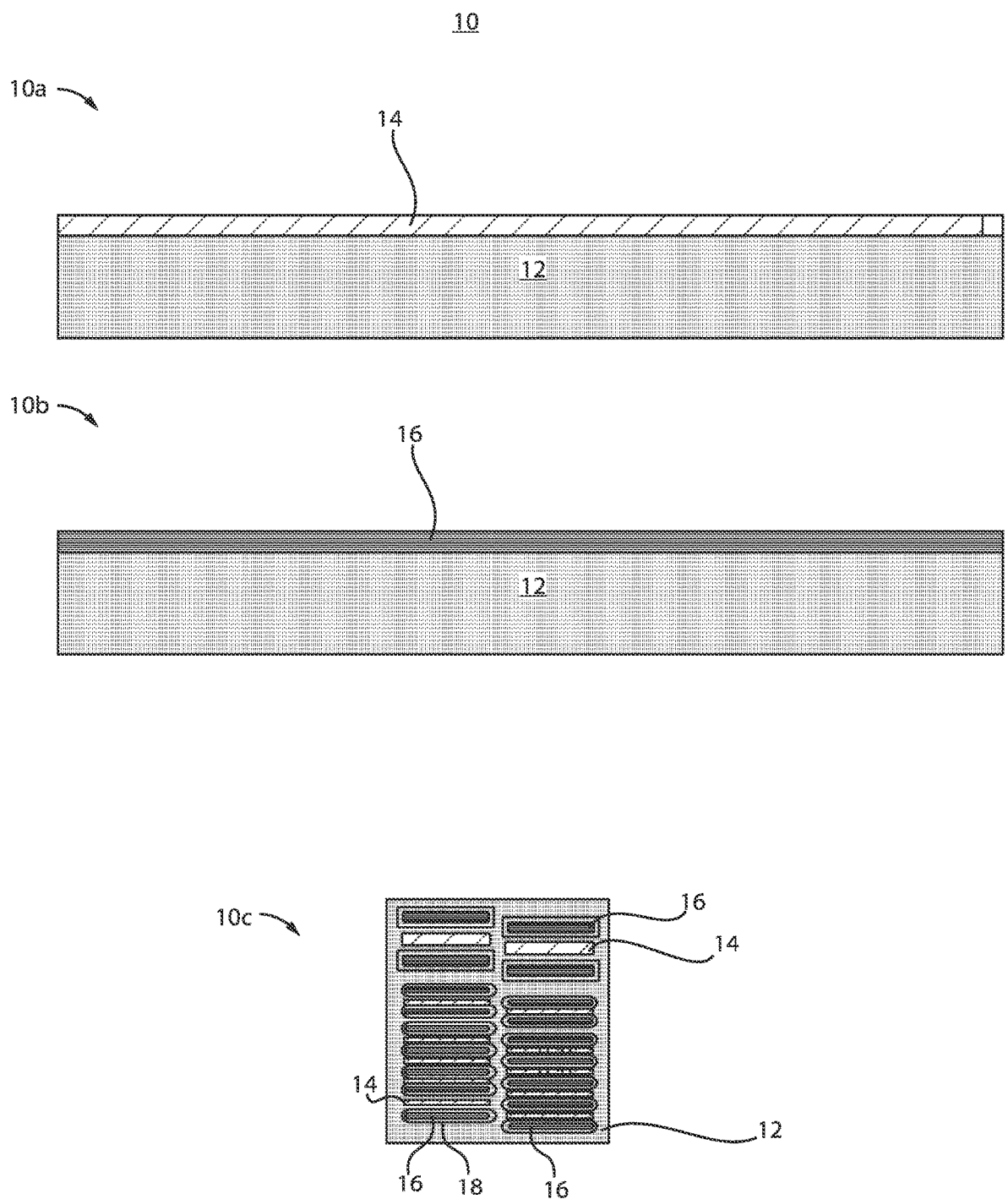
FIG. 1 shows cross-sectional views and a top-down view of odd and even dielectric lines, in accordance with an embodiment of the present invention.

Embodiments of the present invention relate generally to methods and structures for placing top vias at line ends by using a via hardmask for self-aligned line cut. The example embodiments differentiate between lines below the vias and make cuts and vias selectively on even or odd lines (for example, alternating lines). The example embodiments can place the via(s) on both sides or one side of the line cut region (for example, at line ends). Different hardmasks can be used (and in some instances are needed) for even and odd lines. The example embodiments align vias to either an even line or an odd line. The example embodiments are applicable for self-aligned double patterning (SADP) and self-aligned litho-etch-litho-etch (SALELE). The example embodiments can be used after double patterning of lines (once the even and odd lines are patterned with separate hard masks). The example embodiments facilitate area scaling by reducing/eliminating line-end extensions at tight pitches and avoid use of double patterning in some embodiments.

Embodiments of the present invention also relate generally to forming patterns of two adjacent via with minimum distance. The vias can be patterned using direct lithography and spacer based tone inversion and/or a direct self-assembly (DSA) scheme.

Embodiments of the present invention also relate generally to using a top via scheme to form via at line ends without any variation in via critical dimension (CD). According to example embodiments, a top via mask is formed to define the line cut(s) so that the line end(s) is/are self-aligned to the via(s).

Exemplary applications/uses to which the present invention can be applied include, but are not limited to: patterning a via first and using the via hardmask to self-align a cut(s) thereafter in a structure. Exemplary applications include placing top vias at line ends by using via hardmask for self-aligned line cut.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 7 illustrate an example embodiment of processes that may be implemented for placing top vias at line ends by using via hardmask for self-aligned line cut. The processes described with respect to FIGS. 1 to 7 use a top via scheme to form a via(s) at line ends without any variation in via critical dimension (CD) (for example, vias having a uniform CD). Top vias are structures that are formed on top of the lines, rather than below the lines, as in, for example, the case of dual-damascene schemes. The example embodiments provide a process of forming a top via mask to define line cut(s) so that the line end is self-aligned to the via. The example embodiments thereby achieve a level of line end CD uniformity that is impractical (and highly improbable) to achieve with lithography. With lithography, in contrast to the example embodiments, finite overlay shift can cause the via to either move away from line end or be cut off by the line end causing via CD reduction (and/or other variation). The example embodiments prevent the vias moving away from line end or being cut off by the line end and thus prevent via CD reduction. According to example embodiments, different hardmasks are used (for example, needed) for even and odd lines.

Figure 8:
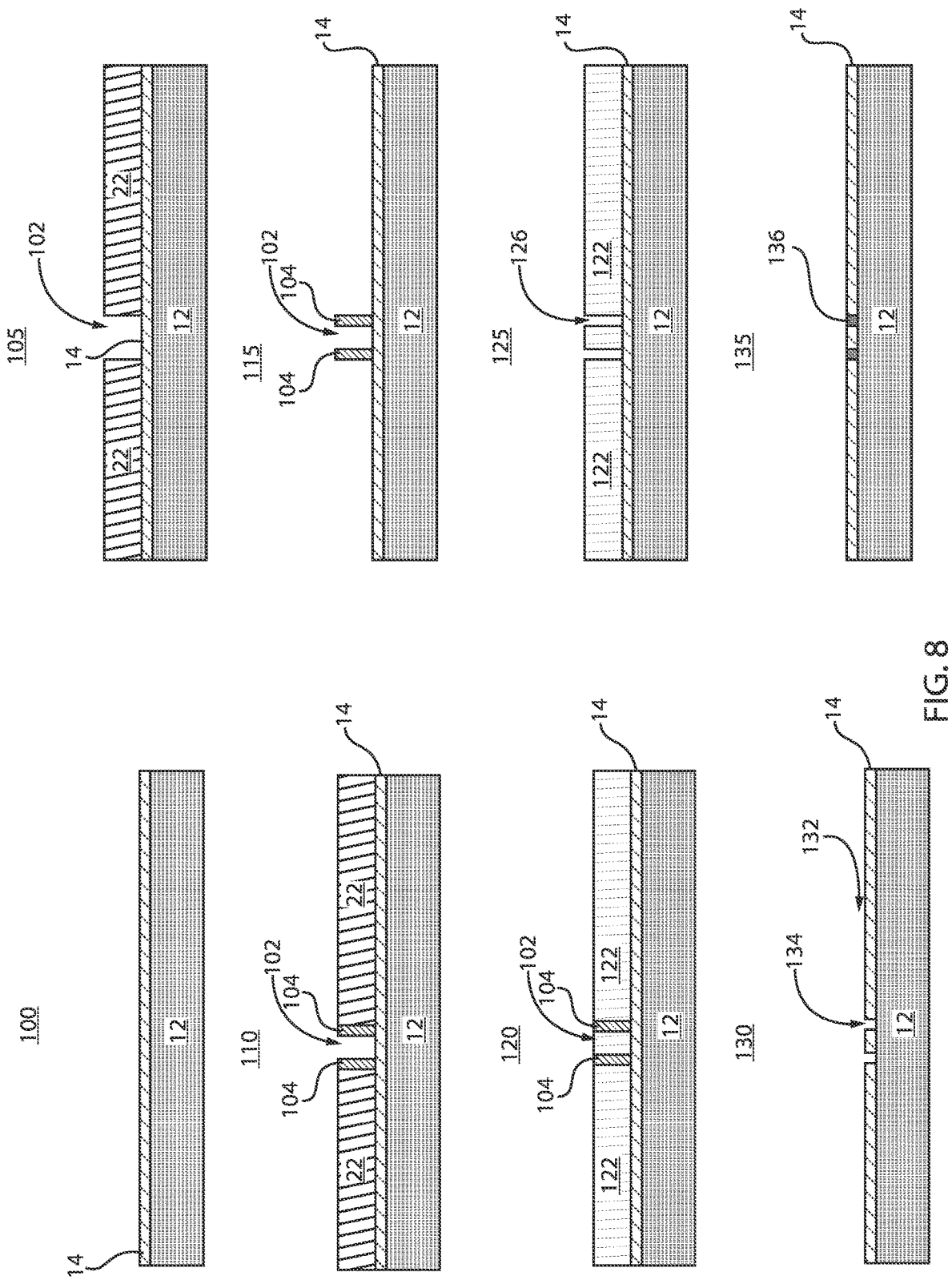
FIG. 8 are cross-sectional views of a process flow using a spacer and tone inversion approach, in accordance with an embodiment of the present invention.
Figure 9:
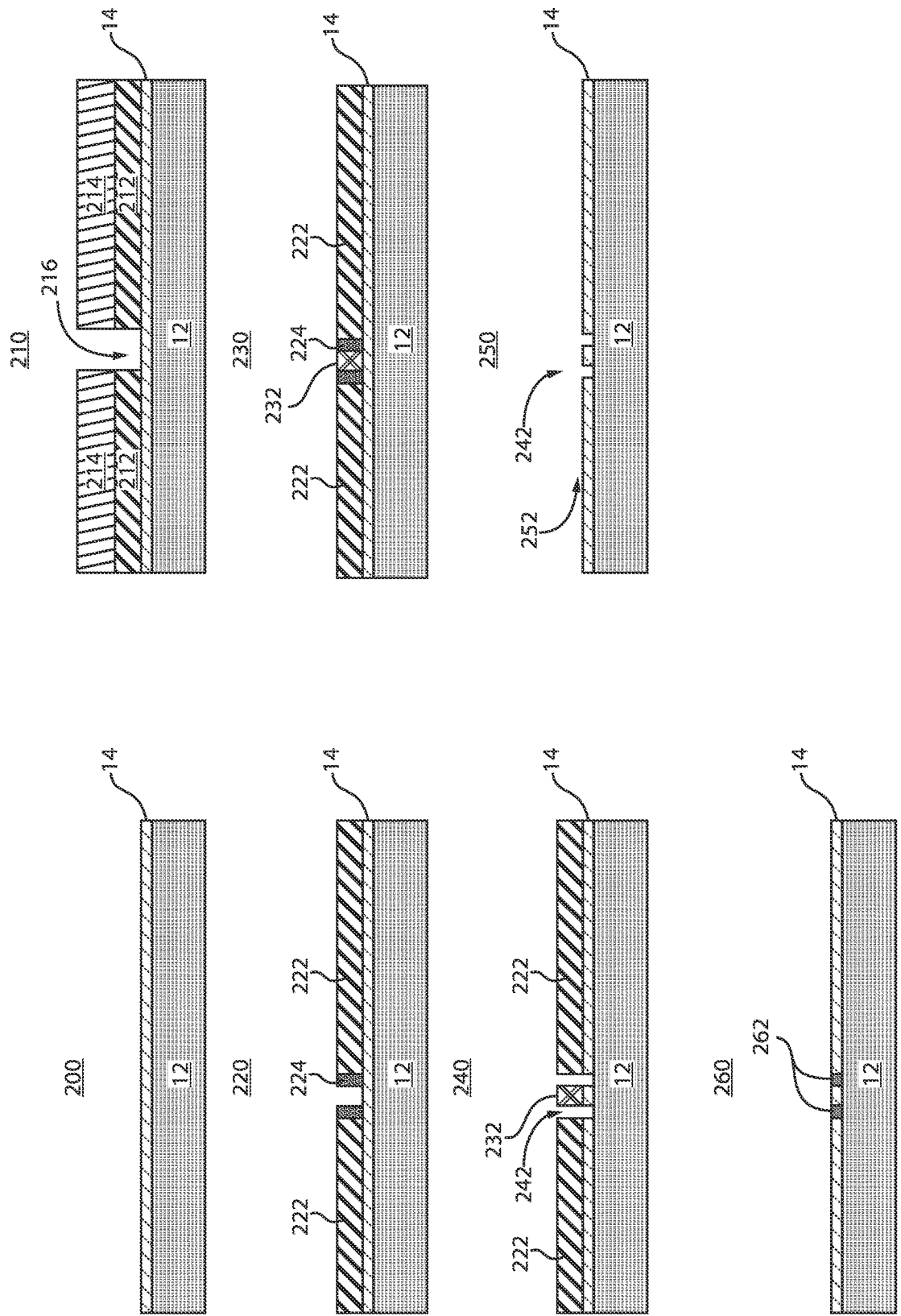
FIG. 9 are cross-sectional views of a process flow using a directed self-assembly (DSA) approach, in accordance with an embodiment of the present invention.

FIGS. 8 and 9 provide processes for via patterning that can be used with the processes for placing top vias at line ends by using via hardmask for self-aligned line cut. Via(s) can be patterned using direct lithography and spacer based tone inversion (FIG. 8). Alternatively, the vias can be patterned using a direct self-assembly (DSA) scheme (FIG. 9). This process places vias on both sides or one side of the line cut region (for example, at line ends). This prevents via CD variation which would otherwise arise from lithographically aligning the via to a previously-formed line cut. In the example embodiments, via CD is defined by lithography and/or spacer thickness and placement of via at the line end is controlled self-aligned metal cut by via mask.

Referring now to the drawings in which like numerals represent the same or similar elements and initially to FIG. 1, cross-sectional views and a top-down view of the making of a structure (stage) 10 that includes odd and even dielectric lines are provided, in accordance with example embodiments.

As shown in FIG. 1, cross sectional view 10a represents an odd line dielectric mask 14, taken, for example, along the length of the (rectangular portions of) hardmask 14 as shown in top-down view 10c, while cross sectional view 10b represents an even line dielectric mask 16, taken, for example, along the length of the hardmask 16 as shown in top-down view 10c, each of which are formed on a metal substrate 12. The odd and even line dielectric masks can be formed in an alternating manner on the metal substrate 12 as shown in the top-down view 10c with a barrier (for example, a spacer) 18 surrounding the even line dielectric masks. In some embodiments barrier 18 is not included.

The metal substrate 12 may be selected from the group consisting of metals, such as, e.g., ruthenium (Ru), tungsten (W), titanium (Ti), tantalum (Ta), aluminum (Al), and nickel (Ni) or other combinations of metals. The metal substrate 12 may be formed by, for example, various methods such as spinning from solution, spraying from solution, chemical vapor deposition (CVD), plasma enhanced CVD (PECVD), sputter deposition, reactive sputter deposition, ion-beam deposition, and evaporation, etc.

The odd line dielectric mask 14 and the even line dielectric mask 16 are selected from hardmasks that have different hardmask materials. The different hardmask materials are selected for the even and odd lines in order to allow selectivity of fabrication processes towards the even and odd lines. For example, the odd line dielectric mask 14 can include silicon nitride (SiN) or amorphous silicon (a-Si) while the even line dielectric mask 16 can include silicon oxide (SiOx) and/or spin on glass (SoG), or vice versa.

Figure 2:
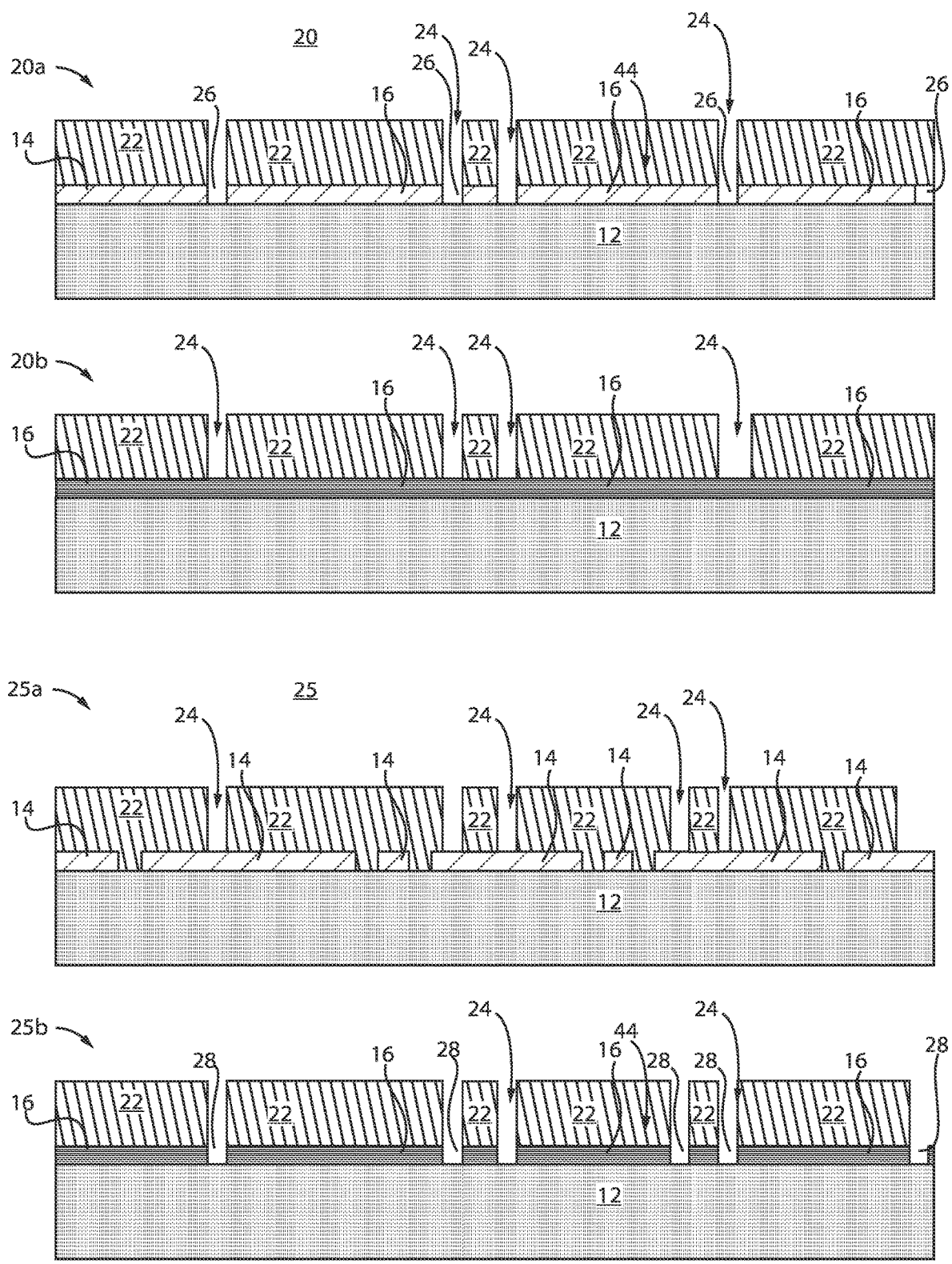
FIG. 2 shows cross-sectional views of the patterning of vias in an odd and even line hardmasks, in accordance with an embodiment of the present invention.

FIG. 2 shows cross-sectional views of a process of patterning of vias in odd and even line dielectric hardmasks, in accordance with example embodiments.

FIG. 2 illustrates a process flow in which vias (odd and even, noted as 26 and 28) are selectively formed (or patterned, planted, etc.) on adjacent lines. The vias (26, shown in cross sectional view 20a cutting into hardmask 14, while not penetrating hardmask 16 (20b)) and 28, shown in cross sectional view 25b cutting into hardmask 16, while not penetrating hardmask 14 by a selective process) are formed by planting the vias 26 on odd lines and separately planting the vias 28 on even lines using a patterning mask 22. The patterning mask 22 can include a planarizing material such as spin-on-carbon, spin-on-glass, or other spin-on material. In example embodiments, patterning mask 22 can include a suitable material or combination of materials for patterning such as a trilayer patterning mask (for example, a trilayer combination including an organic planarization layer (OPL), a silicon containing anti-reflective coating (SiARC), and a photoresist (PR)) or a quadstack patterning mask (for example, a quadstack combination including OPL and silicon oxide formed by a low temperature in-situ radical assisted deposition (iRAD oxide), bottom anti-reflective coating (BARC), and PR).

As shown at stage 20, particularly cross-sectional view 20a, which illustrates the odd line view, vias 26 are planted in the odd line dielectric mask 14. The odd line vias 26 are formed by use of a patterning mask 22. A selective etching process is applied to the underlying odd and even line dielectric masks (14 and 16). The vias 26 are formed in the odd line dielectric mask 14 using a process that is selective to the odd line dielectric mask 14 (for example, etching that stops on the even line dielectric mask 16), when contrasted with the even line dielectric mask 16, as shown in cross-sectional view 20b. The even line dielectric mask 16 is not etched (for example, no vias are formed) at stage 20. For example, the odd line vias can be formed by use of an etching process that removes a material of the odd line dielectric mask 14, such as, for example, silicon nitride (SiN) or amorphous silicon (a-Si) while stopping on a material of the even line dielectric mask 16, such as, for example, silicon oxide ($SiO_x$).

As shown at stage 25, particularly cross-sectional view 25b, which illustrates the even line view, (even line) vias 28 are planted in the even line dielectric mask 16. The even line vias 28 are formed by use of patterning mask 22. A selective etching process is applied to the underlying odd and even line dielectric masks (14 and 16). The even line vias 28 are formed in the even line dielectric mask 16 using a process that is selective to the even line dielectric mask 16, when contrasted with the odd line dielectric mask 14, as shown in cross-sectional view 25a. The odd line dielectric mask 14 is not etched (for example, no vias are formed) at stage 25.

Figure 3:
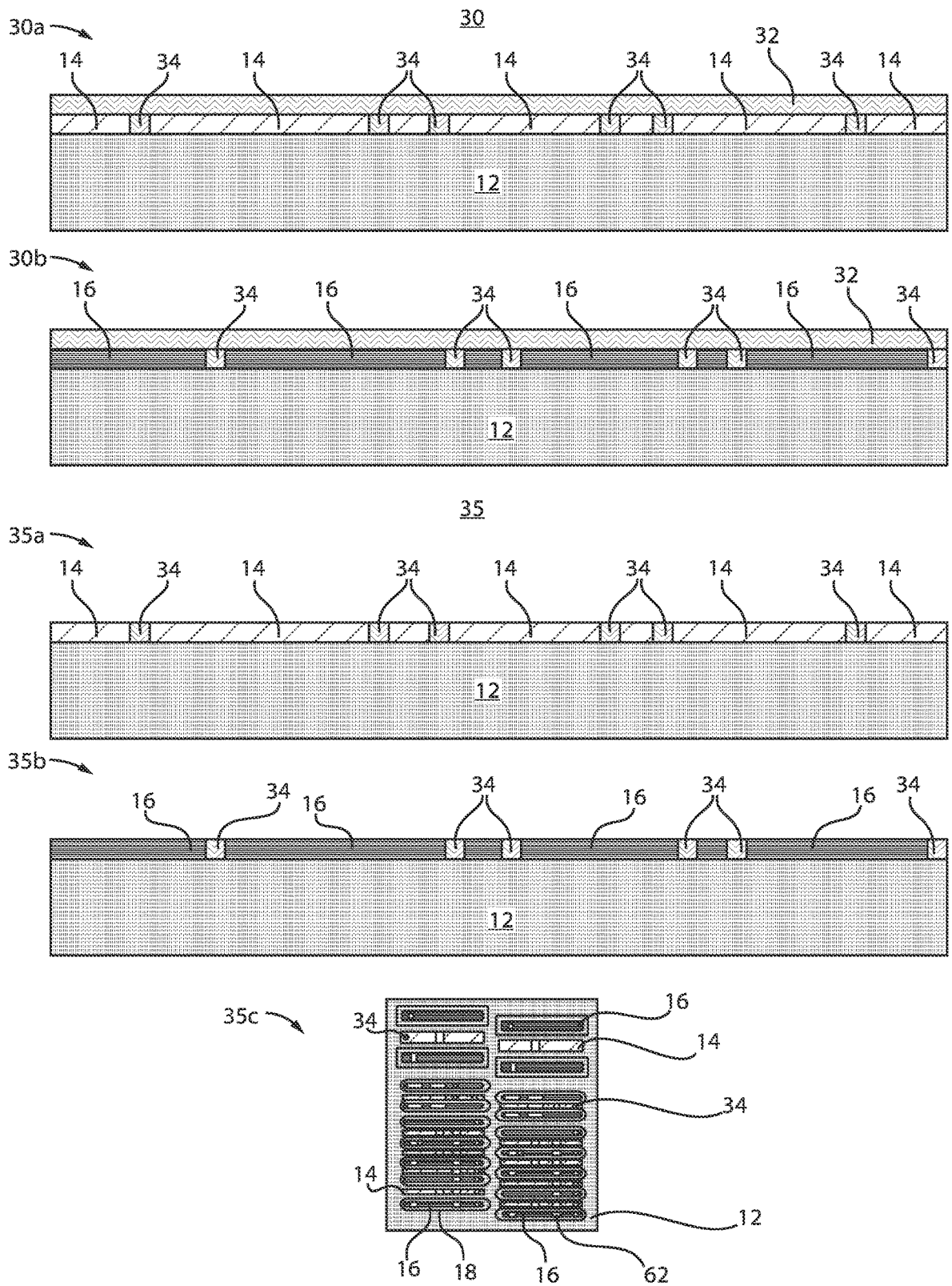
FIG. 3 shows cross-sectional views of filling the vias and polish and etch back of the hardmasks, in accordance with an embodiment of the present invention.

FIG. 3 shows cross-sectional views of filling the vias and polish (or etch back) of the hardmasks, in accordance with example embodiments.

As shown at stage 30, (cross-sectional views 30a (odd line) and 30b (even line)) the process flow includes filling (with via plug 34) the vias (26 and 28) in both (odd and even) lines and covering the surface of the structure (particularly over odd line dielectric mask 14 and the even line dielectric mask 16) with a hardmask layer (HM) 32. The hardmask layer 32 (and consequently via plug 34) can include material selected from titanium oxides ($TiO_x$) or titanium nitrides (TiN). Alternatively, the hardmask layer 32 can include another nitride, for example, a silicon nitride (SiN), an oxynitride, for example, silicon oxynitride (SiON), or a combination thereof. In a particular embodiment, the hardmask layer 32 can be silicon nitride (SiN), for example, $Si_3N_4$.

As shown at stage 35, (cross-sectional views 35a (odd line) and 35b (even line)) the process includes polish (and/or etch back) of the hardmasks (HM) 32. In various exemplary embodiments, the hardmask layer 32 can be reduced (or removed) by chemical-mechanical polishing (CMP) and/or etching. Therefore, the planarization process can be provided by CMP. Other planarization process can include grinding and polishing.

As shown in top-down view 35c, the structure includes odd and even line dielectrics (14 and 16) with via plugs 34.

Figure 4:
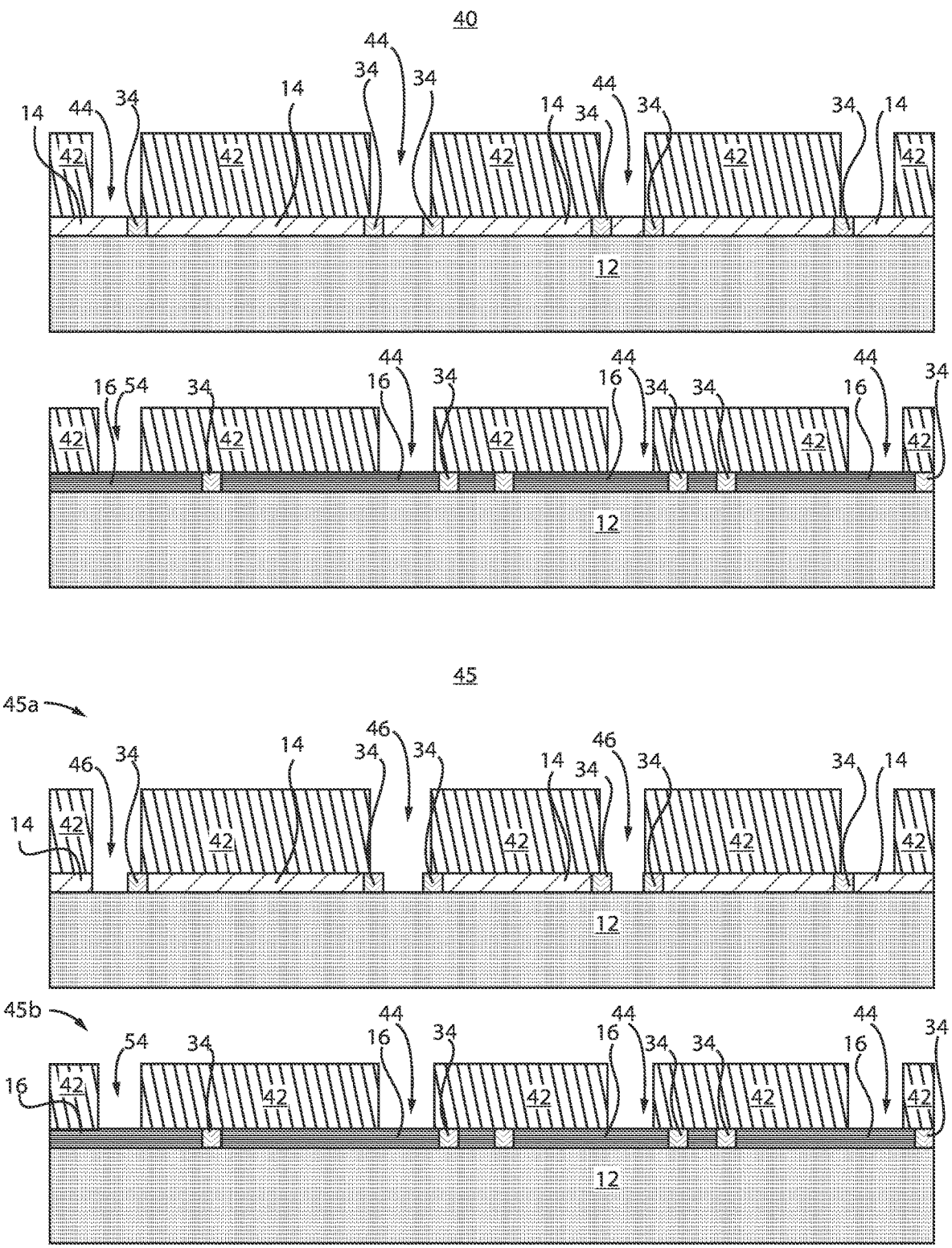
FIG. 4 shows cross-sectional views of cutting of a first hardmask, in accordance with an embodiment of the present invention.

FIG. 4 shows cross-sectional views of cutting of an odd line dielectric hardmask, in accordance with example embodiments.

As shown at stage 40 (cross-sectional views 40a (odd line) and 40b (even line)), a patterning mask 42 is formed (or added, deposited, etc.) on the surface of the structure. The patterning mask 42 includes openings 44 that expose portions of the odd line dielectric mask 14 and the even line dielectric mask 16 and the via plugs 34 formed therein.

At stage 45 (cross-sectional views 45a (odd line) and 45b (even line)), the process includes cutting the odd line dielectric mask 14. The odd line dielectric mask 14 is cut with a process that is selective to the odd line dielectric mask 14 and the even line dielectric mask 16 is not cut (at stage 45). The odd line dielectric mask 14 and the even line dielectric mask 16, as described herein above, are selected from hardmasks that have different hardmask materials and thus allow selectivity of fabrication processes towards the even and odd lines.

Figure 5:
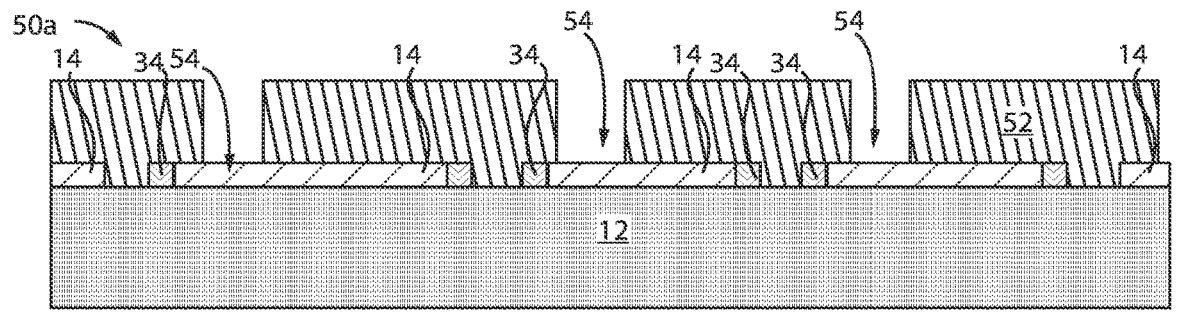
FIG. 5 shows cross-sectional views of cutting of a second hardmask, in accordance with an embodiment of the present invention.
Figure 5:
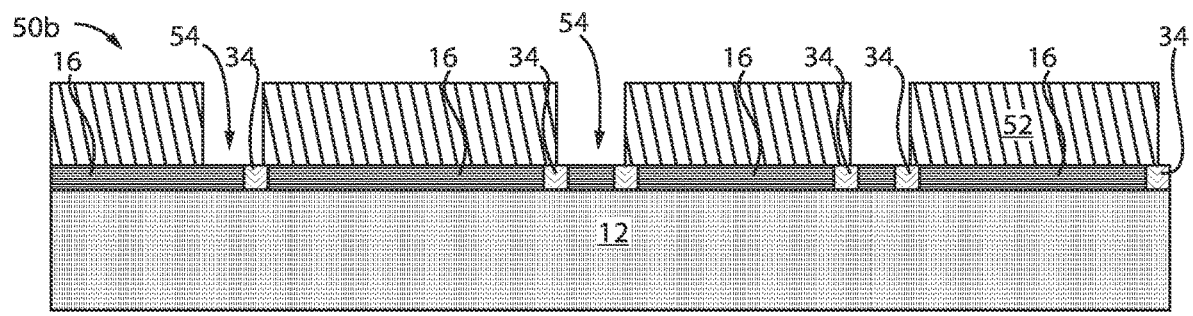
Figure 5:
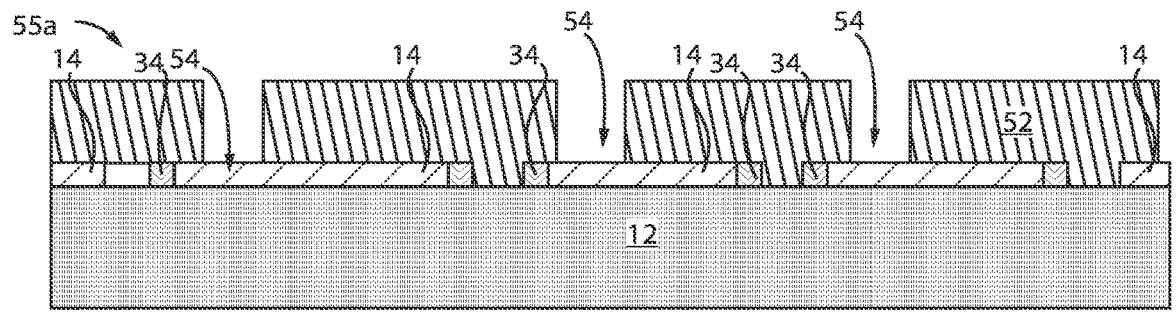
Figure 5:
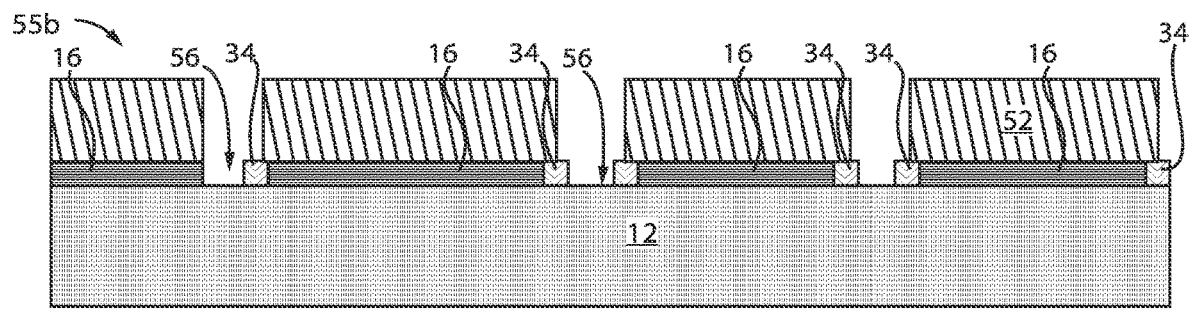

FIG. 5 shows cross-sectional views of cutting of an even line dielectric hardmask, in accordance with example embodiments.

As shown at stage 50 (cross-sectional views 50a (odd line) and 50b (even line)), a patterning mask 52 is formed (or added, deposited, etc.) on the surface of the structure (this can be a same patterning mask as patterning mask 42, described above with respect to FIG. 4). The patterning mask 52 includes openings 54 that expose portions of the odd line dielectric mask 14 and the even line dielectric mask 16 and the via plugs 34 formed therein.

At stage 55 (cross-sectional views 55a (odd line) and 55b (even line)), the process includes cutting the even line dielectric mask 16. The even line dielectric mask 16 is cut with a process that is selective to the even line dielectric mask 16 and the odd line dielectric mask 14 is not cut (at stage 55).

Figure 6:
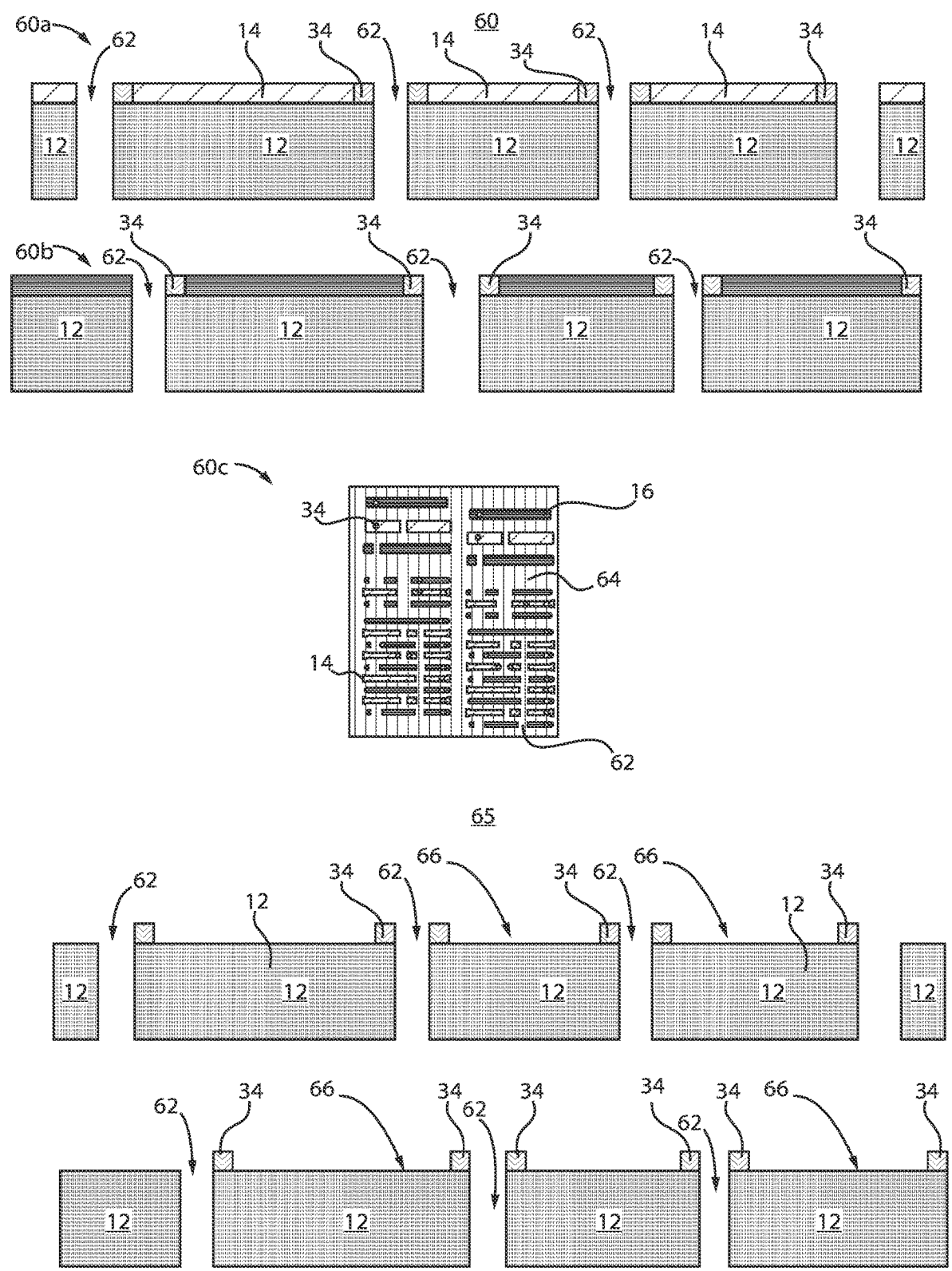
FIG. 6 shows cross-sectional views of cutting of lines and stripping of hardmasks, in accordance with an embodiment of the present invention.

FIG. 6 shows cross-sectional views and a top-down view of cutting of lines and stripping of hardmasks, in accordance with example embodiments.

At stage 60 (cross-sectional views 60a (odd line) and 60b (even line)), the process includes cutting lines 62 into the structure, including through the odd line dielectric mask 14, the even line dielectric mask 16, the via plugs 34 and the (underlying) substrate 12. As shown in top-down view 60c, the structure includes the odd line dielectric mask 14, the even line dielectric mask 16, the via plugs 34 with cut lines 62. The structure also includes a dielectric layer 64 below. The patterning stack has been removed (from stages 40 through 60).

In a further embodiment (not shown) in which metal lines are formed first, and cuts and vias are patterned later, an open area fill can be used prior to implementing cuts and via patterning. In those instances, the open area fill can be selected from materials such as OPL, ultra-low dielectric constant materials (ULK) or $TiO_x$, etc. The open area fill can be deposited by physical vapor deposition (PVD), chemical vapor deposition (CVD), atomic layer deposition (ALD), molecular beam epitaxy (MBE), or any of the various modifications thereof, etc.

At stage 65 (cross-sectional views 65a (odd line) and 65b (even line)), the process includes stripping (66) the odd line dielectric mask 14 and the even line dielectric mask 16 from the structure.

Figure 7:
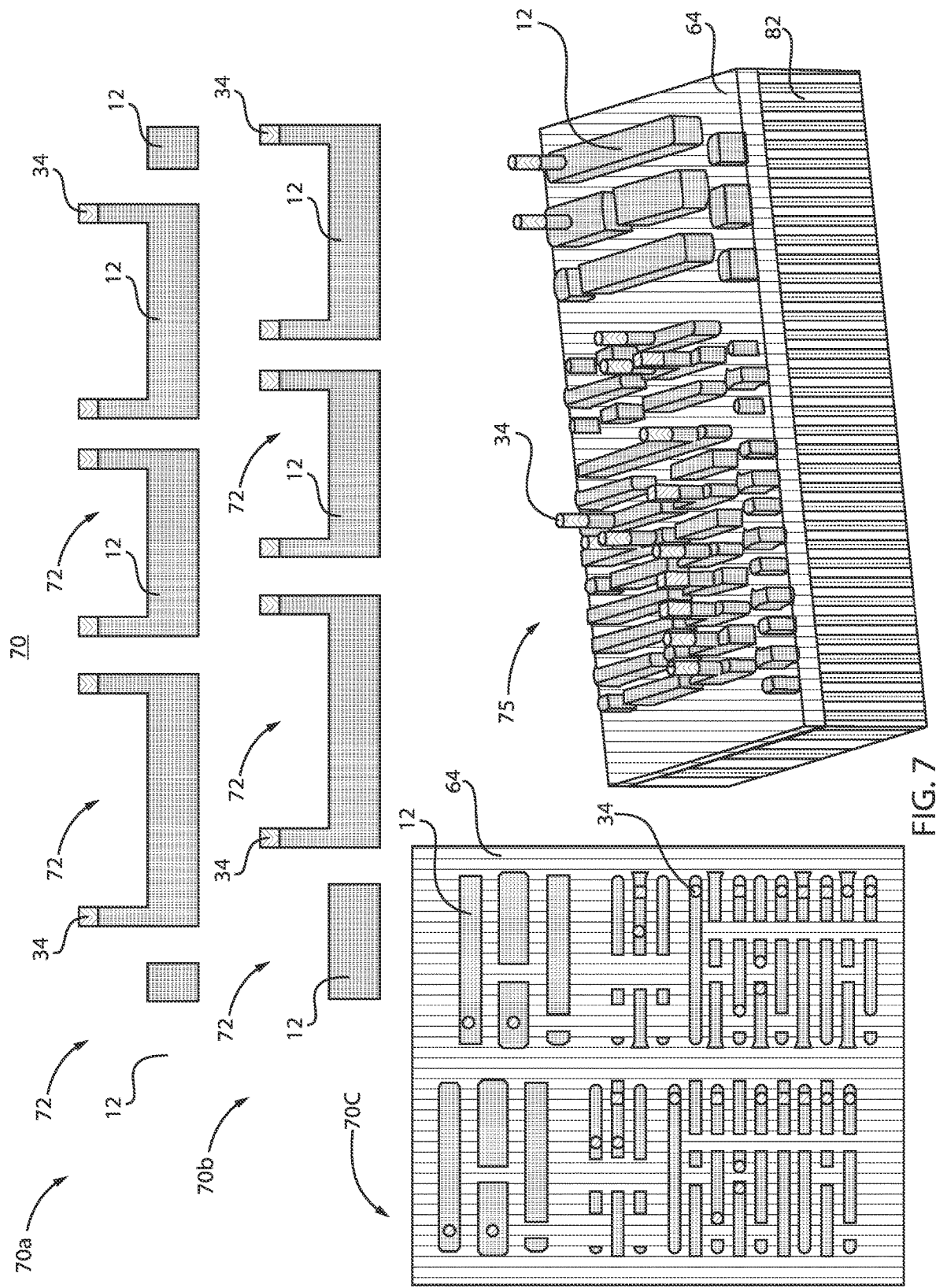
FIG. 7 shows cross-sectional views of recess of lines to form vias and top and perspective views of a final structure, in accordance with an embodiment of the present invention.

FIG. 7 shows cross-sectional views of recess of lines to form vias and top and perspective views of a final structure, in accordance with example embodiments.

At stage 70 (cross-sectional views 70a (odd line) and 70b (even line) and top-down view 70c), the process includes recessing (72) the substrate 12 to form vias. The metal substrate 12 is recessed below the initial height. The process stops at the via plugs 34 and therefore metal line 12 stacks (or columns, ridges, etc.) are formed, topped by the via plugs 34. The line hard masks 14 and 16 are removed (stages 65 through 70), and the conductive layer (metal) 12 is etched to reveal the dielectric from the level below.

An example final structure angled view is shown in embodiment 75. As shown, the structure 75 contains metal lines 12 with self-aligned top via 34 (or up via) at line ends with self-aligned vias formed on both sides or one side of the line cut region (for example, at line ends). The metal lines 12 are formed on a substrate 82. In the example embodiments, there is line end via uniformity and there is no line end via CD variation which would otherwise arise from lithographically aligning the via to a previously-formed line cut. The via CD at line end is controlled by the spacer thickness, for example, as described with respect to FIGS. 8 and 9.

According to example embodiments, the vias are all directly at the end of the line. The self-aligned via at line ends can be made in a subtractive etch in contrast to cutting lines for damascene metal lines.

Substrate 82 may be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Germanium; carbon-doped oxides; inorganic oxides; inorganic polymers; hybrid polymers; organic polymers such as polyamides; other carbon-containing materials; organo-inorganic materials such as spin-on glasses and silsesquioxane-based materials; and diamond-like carbon (DLC, also known as amorphous hydrogenated carbon, a-C:H).

FIG. 8 and FIG. 9 illustrate processes for forming a pattern for two adjacent via with minimum distance. The processes (for example, schemes) provided in FIGS. 8 and 9 can be substituted into the process flow described herein above with respect to FIGS. 1 to 7, particularly at stages 10 to 35 (FIGS. 1 to 3) to form adjacent vias with minimum distance.

FIG. 8 illustrates cross-sectional views of a process flow using a spacer and tone inversion approach, in accordance with example embodiments.

At stage 100, an initial structure includes an odd line dielectric mask 14 formed on a conductive (for example, metals, graphite, ceramics, etc.) substrate 12. It should be appreciated that although FIG. 8 and the ensuing discussion are directed towards an odd line, the principles for forming the adjacent vias are equally applicable to even line dielectrics, as described herein.

At stage 105, the process includes forming trench 102. The trench 102 is formed with a breadth that spans an area at which a pair of vias plus the line cut are to be formed on the structure. The trench 12 is formed in a patterning mask 22.

At stage 110, the process includes applying a spacer 104 to the trench 102. The spacer 104 can be formed by etch back of a spacer layer that is deposited within (or along the sides of) the trench 102. The spacer 104 can be conformally formed along the sidewalls of the trench 102. For example, the spacer 104 can be deposited conformally by using ALD or CVD process. The spacer 104 can include any suitable dielectric material in accordance with the embodiments described herein. In a preferred embodiment, for even lines with SiN or a-Si HM, a SiN spacer can be used. In one embodiment, the spacer 104 can include a low-k dielectric material. Examples of suitable dielectric materials for the spacer 104 include, but are not limited to, oxides, nitrides and/or oxynitrides.

At stage 115, the process includes etch back of the patterning mask 22. For example, the etch back can be performed by reactive ion etching (RIE) or other suitable process. The patterning mask 22 is stripped from the structure. The spacers 104, positioned on the odd line dielectric mask 14, remain after the patterning mask 22 is removed.

At stage 120, the process includes backfill 122 and CMP (and/or etch back) of the backfilled material. Backfill material 122 is deposited over the surface of the structure (for example, over the odd line dielectric mask 14) and between the spacers 104. The backfill material 122 can include titanium based material, such as, e.g., $TiO_x$, TiN, etc. Other suitable materials can be used to backfill the surface of the structure around the spacers 104.

At stage 125, the process includes removing (for example, pulling out) the spacers 104 from the backfill material 122 leaving spaces 126 (or holes, openings, etc.) in the backfill material 122. The spaces 126 expose portions of the odd line dielectric mask 14.

At stage 130, the process includes etching of the odd line dielectric mask 14 (via the spaces 126 in the backfill material 122). The odd line dielectric mask 14 is etched to the metal substrate 12 (creating via openings 134) and then the backfill material 122 is stripped 132 from the structure. The odd line dielectric mask 14 at this stage includes via openings 134.

At stage 135, the process includes filling the via openings 134 with via plugs 136 and performing CMP or etch back to form the odd line dielectric mask 14 with vias.

FIG. 9 provides cross-sectional views of a process flow using a directed self-assembly (DSA) approach, in accordance with example embodiments.

At stage 200, an initial structure includes an odd line dielectric mask 14 formed on a metal substrate 12. It should be appreciated that although FIG. 9 and the ensuing discussion are directed towards an odd line, the principles for forming the adjacent vias are equally applicable to even line dielectrics, as described herein.

At stage 210, the process includes adding a guiding pattern layer 212 and a patterning mask 214. A shape 216 of a (for example, large) via and cut is etched into guiding pattern layer 212 and patterning mask 214, for example, using RIE. The etched space 216 is prepared in anticipation of providing vias and a cut therein. The guiding pattern layer 212 can include materials selected from SiN, TiN, TaN, $TiO_x$. The patterning mask 214 can include a suitable material or combination of materials for patterning such as a trilayer patterning mask (for example, organic planarization layer (OPL)/silicon containing anti-reflective coating (SiARC)/PR trilayer) or a quadstack patterning mask.

At stage 220, the process includes stripping the patterning mask 214, and implementing DSA on the structure. Particularly, DSA spacers 224 are added to the structure in the etched space with the shape 216 of a via and cut (between the remaining guiding pattern layer 212).

At stage 230, the process includes adding a tone invert 232 to fill the gap 216 between DSA spacers 224. The tone invert 232 can include tone inversion material that has properties including: (i) filling small gaps well (in the context of tone inverted graphoepitaxy, the ability to fill 10 nm-wide trenches with at least 30 nm height at a 28 nm pitch is required); (ii) reasonable planarization (planarization of the above substrate to within 5 nm thickness is required for an etch back process to reveal all patterns at the same time given that the substrate has a uniform pattern density across the whole wafer); and/or (iii) good etch resistance to subsequent etch transfer steps.

At stage 240, the process includes stripping out the DSA spacers 224. The odd line dielectric mask 14 is then etched at the positions from which the DSA spacers 224 have been removed. Via openings 242 are thereby formed in the odd line dielectric mask 14.

At stage 250, the process includes stripping 252 guiding pattern layer 212 and tone invert 232 from the structure. The use of the tone invert 232 allows the benefits as described with respect to stage 230, such as small gaps, good etch resistance, etc. Tone inversion in this instance allows the formation of two vias at the ends of lines that would otherwise require multiple patterning steps (for example, via 1 mask, via 2 mask, and line cut mask) due to how close the features are to each other.

At stage 210, the process includes filling the via openings 242 with via plugs 262 and performing CMP or etch back to form an odd line dielectric mask 14 with via plugs 262.

Figure 10:
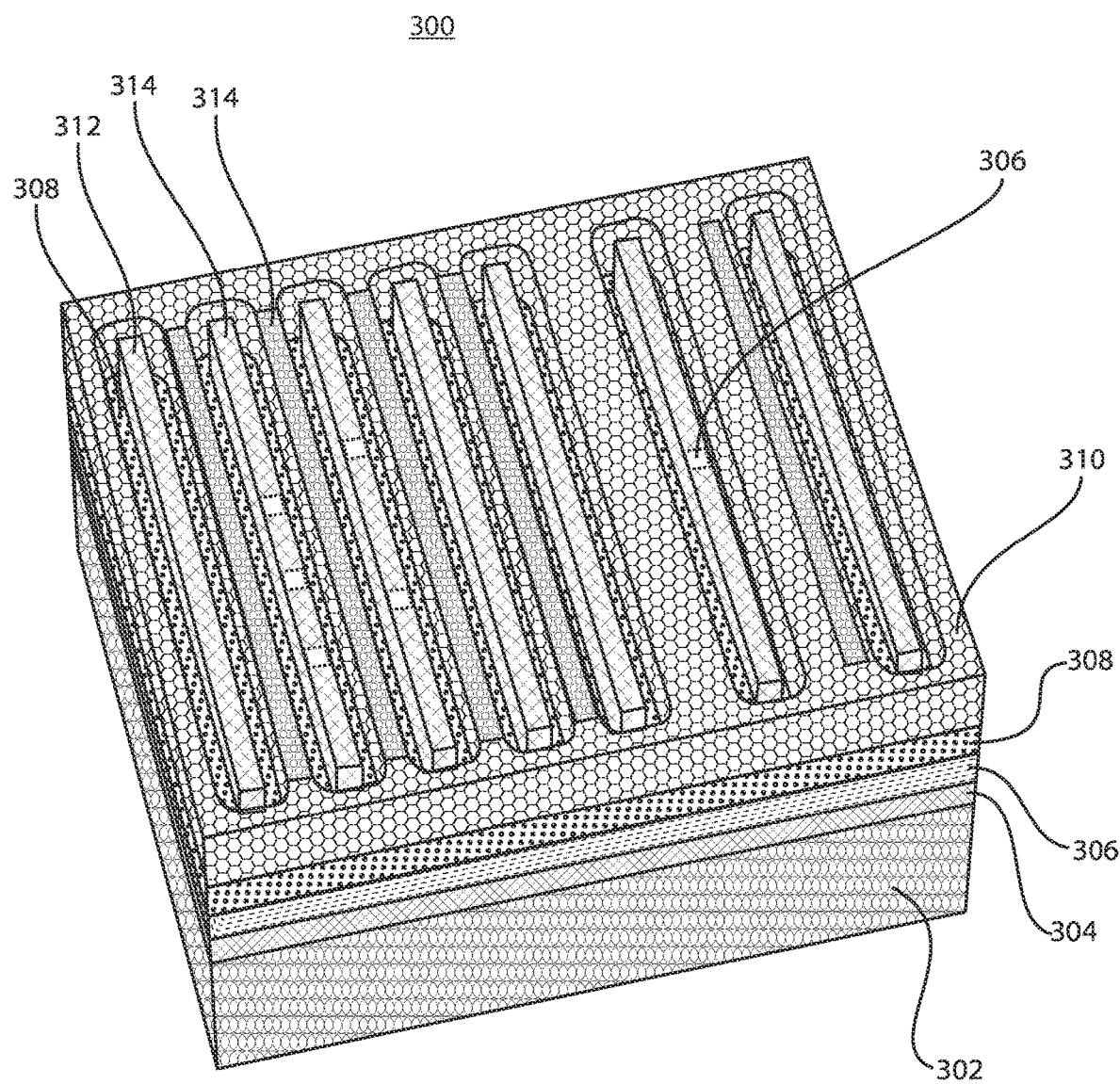
FIG. 10 is a diagram showing a perspective view of vias patterned only on the odd lines, in accordance with an embodiment of the present invention.

FIG. 10 is a diagram showing a perspective view of vias patterned only on the odd lines, in accordance with example embodiments.

As shown in FIG. 10, the structure 300 includes vias 306 that are patterned only on the odd lines 312 (for example, odd line hardmasks). There are no vias patterned on the even lines 314 (for example, even line hardmasks). As described with respect to example embodiments, the odd line vias 306 and even line vias (not shown in FIG. 10) are patterned in separate steps. The odd line hardmasks 312 and the even line hardmasks 314 can be a similar composition as the odd line dielectric mask 14 and the even line dielectric mask 16 described with respect to FIG. 1 herein above. The structure 300 also includes a substrate 302 (for example, silicon (Si) or other suitable material), a template dielectric 304 (for example, SiN, SiCOH, SiO$_2$, etc.), a metal layer 306 (including, for example, Ru, Cu, Al, etc.), a bottom (for example, general to the device) hardmask 308, and a planarization (or planarizing) layer 310 (composed of planarization material).

Figure 11:
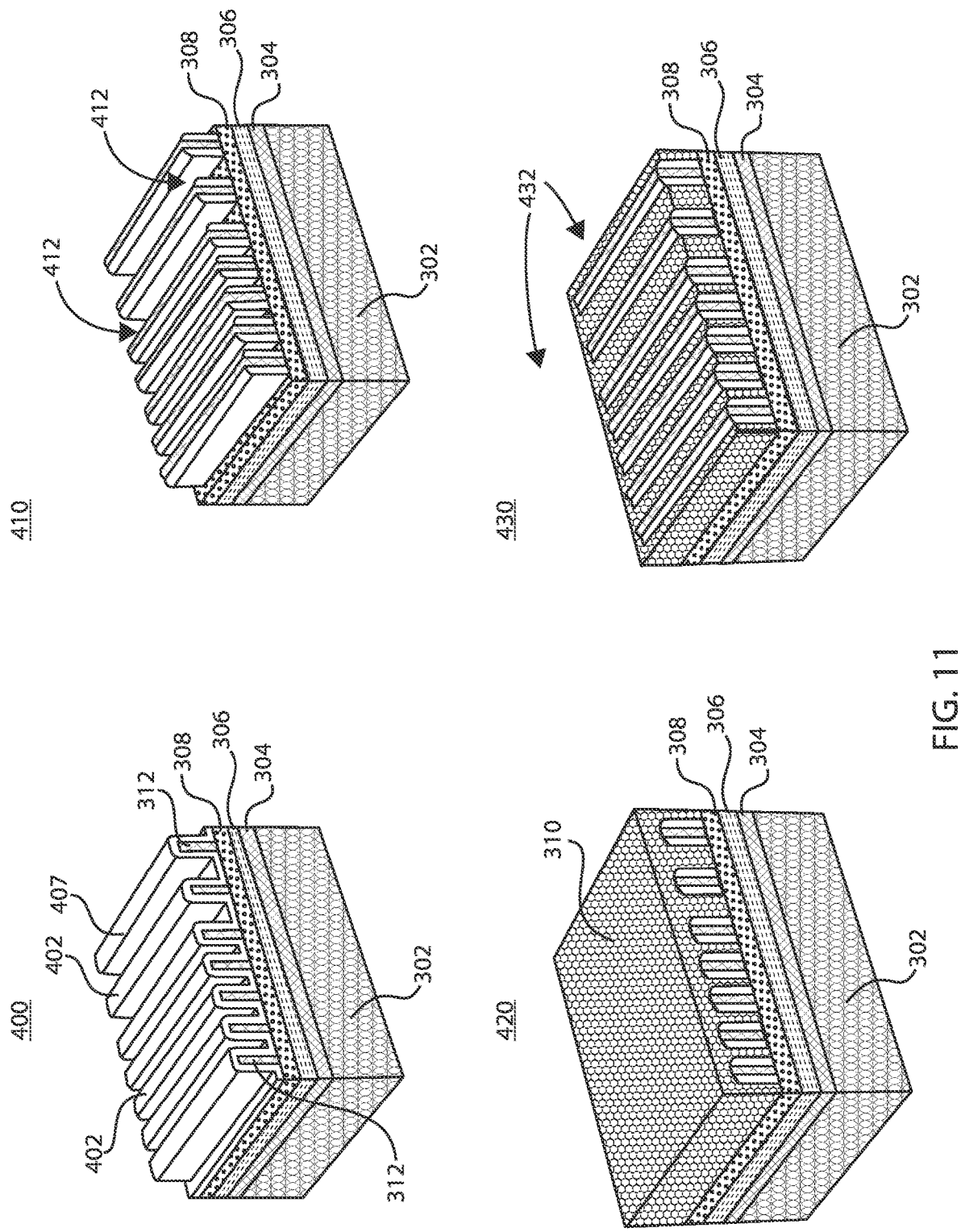
FIG. 11 are cross-sectional views of a process flow for selective via patterning, in accordance with an embodiment of the present invention.
Figure 12:
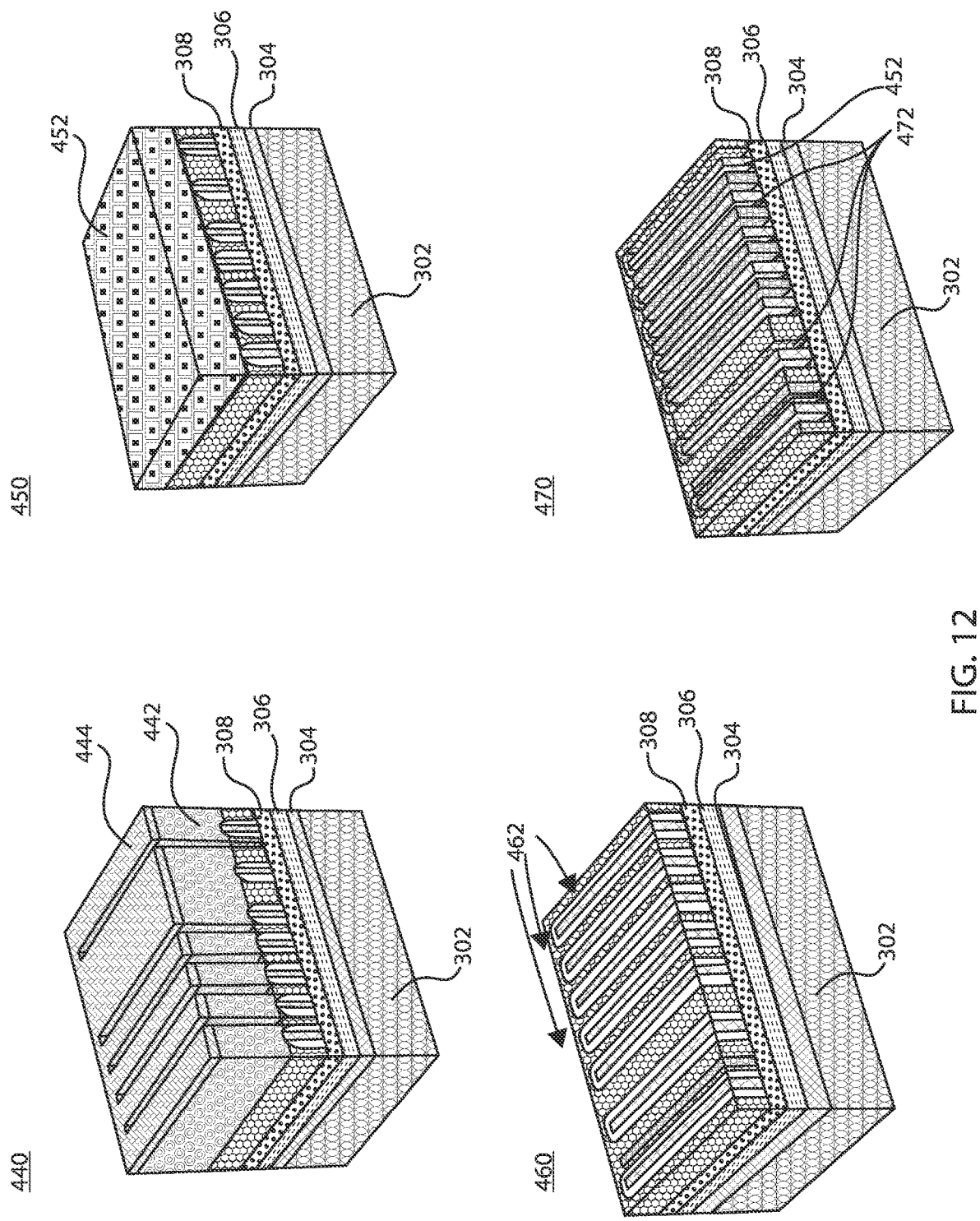
FIG. 12 are cross-sectional views of a process flow for selective via patterning, in accordance with an embodiment of the present invention.

The processes described with respect to the example embodiments of FIGS. 10 to 12 allow patterning on (for example, relatively) smaller pitches (for example, approximately ~24 nanometers (nm)) than can be effectively implemented with single-step patterning. The example embodiments allow, in addition to double patterning of trenches, patterning vias along with the trenches for back-end-of-line structures. The example embodiments thereby facilitate scaling down of nodes. Nodes in this instance can include technology nodes. The example embodiments allow shrinking of features for technologies that can include, by way of example, 7 nm, 5 nm, and 3 nm nodes. The example embodiments allow double patterning of the trenches, and double patterning of the vias in a manner that overcomes the limitations of patterning small features such as these vias (for example, limitations with respect to incumbent methods of fabrication).

FIG. 10 shows selective patterning of vias, which reduces the probability of unwanted cuts and/or dents in adjacent lines caused by lithography and patterning errors.

FIGS. 11 to 12 collectively and sequentially illustrate an example embodiment of processes that may be implemented for selective via patterning for (for example, pitches of ~24 nm) subtractive metal trenches.

Selective etch of odd and even lines requires two different fill materials for selective patterning on either of the lines. According to example embodiments, the two different fill materials include two films that have high selectivity to each other, enabling larger cut and via patterns, without resulting in unwanted shorts. In an example embodiment, etch selectivity between the two materials is greater than 20:1. Other etch selectivity ranges can be implemented. The processes described with respect to FIGS. 11 to 12 allow selective deposition of two different materials in adjacent (odd and even) lines enabling selective patterning of cuts and vias on these lines.

FIG. 11 are cross-sectional views of a process flow for selective via patterning, in accordance with example embodiments.

At stage 400, a structure is provided that includes layers such as a substrate 302, a template dielectric 304, a metal layer 306, a bottom (device) hardmask 308, and an odd line hardmask 312. The odd line hardmask 312 is patterned (at, for example, double pitch). Spacer material is deposited (for example, a second metal layer 402) with thickness equaling the desired (for example, target) pitch. The second metal layer 402 may cover the exposed portions of the bottom hardmask 308 and the entire ridge structure of the odd line hardmask 312 (for example, including the sidewalls and top portion of the odd line hardmask 312).

At stage 410, the process includes performing spacer etch back to expose tips of the odd line hardmask 312 (for example, hardmask material) and expose the bottom hardmask 308.

At stage 420, the process includes depositing a planarization layer 310 which protects the line ends, avoiding the shorting of lines for SALELE. The planarization layer 310 (can be filled to a level above the current structure and) covers the exposed tips of the odd line hardmask 312, the second metal layer 402 and the exposed bottom hardmask 308.

At stage 430, the process includes etching 432 the planarization layer 310 to expose tips of the odd line hardmask 312 and spacer material (second metal layer 402). The planarization layer 310 is removed above the level of the exposed tips of the odd line hardmask 312 and second metal layer 402.

FIG. 12 are additional cross-sectional views of a process flow for selective via patterning, in accordance with example embodiments.

At stage 440, the process includes patterning the even lines and transferring the pattern to the planarizing material (planarization layer 310). More particularly, stage 440 includes adding a fill material for pattern transfer 442 to the structure. Photoresist material 444 is also added to the structure. Photoresist is a light-sensitive material that can be used in processes, such as photolithography and photoengraving, to form a patterned coating on a surface. The even lines are then patterned and the pattern us transferred to planarization layer 310.

At stage 450, the process includes depositing a second hardmask material (even line hardmask material 452) which fills the patterns exposed in the previous stage (stage 440).

At stage 460, the process includes etching 462 the even line hardmask material 452 to expose the bottom hardmask 308, the spacer (second metal layer 402), and the planarizing material (planarization layer 310).

At stage 470, the process includes removing the second metal layer 402 to expose selectively patternable odd and even lines for a subtractive etch.

The example embodiments facilitate hyper-scaling while maintaining high yield and reliability. Selectively patterning the cuts and vias for a subtractive etch using the example embodiments reduces (or eliminates) the probability of unwanted features, increasing the chances of a better yield. The example embodiments allow memorizing of selective patterns. Using these selective hardmasks allows the patterning of line-end vias as described herein above with respect to FIGS. 1 to 7.

FIG. 13 is a flow diagram showing a method 500 for placing vias at line ends by using via hardmask for self-aligned line cut, in accordance with example embodiments.

The method 500 can be implemented in accordance with structures and processes described herein above with respect to FIGS. 1 to 9. The example embodiments described in method 500 provide a process of forming a top via mask to define line cut so that the line end is self-aligned to the via.

At block 510, a structure is formed with an odd line hardmask and an even line hardmask. The even and odd metal lines have different hardmask materials that have different selectivity with respect to each other. For example, the even line may have a SiN or a-Si hardmask and the odd line may have a SiOx or SoG hardmask, or vice versa.

At block 520, vias are patterned separately into the odd line hardmask and the even line hardmask. The vias may be patterned using direct lithography and spacer based tone inversion or a direct self-assembly (DSA) scheme.

At block 530, metal cut lithography is then done to cut even and odd lines. The cuts are self-aligned with the via. The method can control placement of the vias to the line ends by performing a self-aligned metal cut by via mask. The line cut thereby defined includes line ends that are self-aligned to the via.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of structures and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure, comprising:
a first metal line having a planar upper surface across its width colinearly disposed relative to a second metal structure in a same layer, wherein the first metal line includes a single line end that a subtractively etched self-aligned via is positioned on adjacent to a line cut region, wherein the subtractively etched self-aligned via is etched from the first metal line and the subtractively etched self-aligned via and the first metal line share a vertical boundary at an end portion of the first metal line facing towards the second metal structure.

2. The semiconductor structure of claim 1, wherein the single line end includes no line end critical dimension variation based on self-aligning of the subtractively etched self-aligned via.

3. The semiconductor structure of claim 1, wherein a via critical dimension at the single line end is controlled by a spacer thickness.

4. The semiconductor structure of claim 1, wherein the subtractively etched self-aligned via is directly at the single line end.

5. The semiconductor structure of claim 1, wherein the subtractively etched self-aligned via is directly on an upper surface of the first metal line.

6. The semiconductor structure of claim 1, wherein a composition of the first metal line is different from a composition of the subtractively etched self-aligned via.

7. The semiconductor structure of claim 1, wherein the first metal line and the second metal structure are present in a line level further comprising a line level dielectric.

8. The semiconductor structure of claim 7, wherein the subtractively etched self-aligned via is present in a via level further comprising a via level dielectric.

9. The semiconductor structure of claim 8, wherein the via level dielectric has a different composition than the line level dielectric.

10. A semiconductor structure, comprising:
a first metal line having a planar upper surface across its width colinearly disposed relative to a second metal structure in a same layer; and
a subtractively etched self-aligned top via positioned on a single line end of the planar upper surface of the first metal line, wherein the single line end is formed adjacent to a line cut region, and the subtractively etched self-aligned top via is positioned on the single line end of the first metal line contacting a top surface of the first metal line, wherein the subtractively etched self-aligned top via is etched from the first metal line and the subtractively etched self-aligned top via and the first metal line and share a vertical boundary at the single line end facing towards of the second metal structure.

11. The semiconductor structure of claim 10, wherein the single line end includes no line end critical dimension variation based on self-aligning of the subtractively etched self-aligned top via.

12. The semiconductor structure of claim 10, wherein a via critical dimension at the single line end is controlled by a spacer thickness.

13. The semiconductor structure of claim 10, wherein a composition of the first metal line is different from a composition of the subtractively etched self-aligned top via.

14. The semiconductor structure of claim 13, wherein the first metal line and the second metal structure are present in a line level further comprising a line level dielectric.

15. The semiconductor structure of claim 14, wherein the subtractively etched self-aligned top via is present in a via level further comprising a via level dielectric.

16. The semiconductor structure of claim 15, wherein the via level dielectric has a different composition than the line level dielectric.

17. A semiconductor structure, comprising:
a line level including a line level dielectric having a first metal line having a planar upper surface across its width colinearly disposed relative to a second metal structure; and
a via level atop the line level including a subtractively etched self-aligned top via positioned on a single line end of the planar upper surface of the first metal line, wherein the single line end is formed adjacent to a line cut region, wherein the subtractively etched self-aligned top via is etched from the first metal line and the subtractively etched self-aligned via and the first metal line share a vertical boundary at an end portion of the first metal line facing towards the second metal structure.

18. The semiconductor structure of claim 17, wherein at least one line end includes no line end critical dimension variation based on self-aligning of the subtractively etched self-aligned top via.

19. The semiconductor structure of claim 17, wherein a via critical dimension at the single line end is controlled by a spacer thickness.

* * * * *